(12) United States Patent
Pan et al.

(10) Patent No.: US 8,121,167 B2
(45) Date of Patent: Feb. 21, 2012

(54) DUAL WAVELENGTH LASER DEVICE FOR OPTICAL COMMUNICATION

(75) Inventors: Jin-Shan Pan, Hsinchu (TW);
Shang-Cheng Liu, Jhubei (TW);
Cheng-Ju Wu, Jhubei (TW);
Chang-Cherng Wu, Jhubei (TW)

(73) Assignee: Truelight Corporation, Hsin-Chu (TW)

( * ) Notice: Subject to any disclaimer, the term of this patent is extended or adjusted under 35 U.S.C. 154(b) by 301 days.

(21) Appl. No.: 12/436,324

(22) Filed: May 6, 2009

(65) Prior Publication Data

US 2009/0279578 A1    Nov. 12, 2009

(30) Foreign Application Priority Data

May 8, 2008   (TW) ................................ 97117063 A (51) Int. Cl.
*H01S 5/00* (2006.01)

(52) U.S. Cl. .... 372/50.121; 372/34; 372/36; 372/50.12; 372/50.122; 372/50.124; 257/678; 257/684; 257/701; 257/704; 257/711; 257/723

(58) Field of Classification Search ................ 372/34, 372/36, 50.12, 50.121, 50.122, 50.124; 257/678, 257/684, 701, 704, 710, 711, 723
See application file for complete search history.

(56) References Cited

U.S. PATENT DOCUMENTS

| | | | | |
|---|---|---|---|---|
| 4,901,325 | A * | 2/1990 | Kato et al. | 372/44.011 |
| 6,038,243 | A * | 3/2000 | Mogi | 372/50.121 |
| 6,456,635 | B1 * | 9/2002 | Shiomoto et al. | 372/36 |
| 7,177,331 | B2 * | 2/2007 | Yen et al. | 372/28 |
| 2007/0019960 | A1 * | 1/2007 | Kuwata et al. | 398/118 |
| 2007/0242712 | A1 * | 10/2007 | Funada | 372/36 |
| 2007/0274360 | A1 * | 11/2007 | Inoue et al. | 372/49.01 |
| 2008/0181270 | A1 * | 7/2008 | Lin et al. | 372/32 |
| 2008/0234560 | A1 * | 9/2008 | Nomoto et al. | 600/310 |

* cited by examiner

*Primary Examiner* — Yuanda Zhang
(74) *Attorney, Agent, or Firm* — Chun-Ming Shih; HDLS IPR Services (57) ABSTRACT

A dual wavelength laser device including a cap, a header, a first laser chip and a second laser chip. The cap includes a cap body and a lens embedded on the cap body. The header forms an accommodating space with the cap. The first laser chip is arranged in the accommodating space and emitting a first laser beam toward the lens. The second laser chip is arranged in the accommodating space and emitting a second laser beam toward the lens.

7 Claims, 13 Drawing Sheets

DUAL WAVELENGTH LASER DEVICE FOR OPTICAL COMMUNICATION

BACKGROUND OF THE INVENTION

1. Field of the Invention

The present invention relates to an optoelectronic device, in particular to a laser device for optical communication.

2. Description of Related Art

The internet provides a platform for exchanging information. Since the amount of transmitted information like video or audio signal is gradually increased on the internet, the maximum transmission bandwidth of a traditional cable will not be enough in the future. That makes optical fiber replaces the traditional cable to provide larger bandwidth for user.

In order to further increase the amount of transmitted information of the optical fiber, wavelength division multiplex (WDM) technology which can transmit information by several light beams with different wavelengths in an optical fiber is applied to increase the amount of transmitted information.

Conventional triple-wavelength bidirectional WDM optical transmission system has a transmitter optical subassembly (TOSA) and a receiver optical subassembly (ROSA) corresponding to the TOSA. The TOSA has two laser devices and one detecting device mounted together. Each of the laser devices has a laser chip mounted in a TO-CAN package. The detecting device has a detecting chip mounted in a TO-CAN package.

However, the three TO-CAN packages make the TOSA have bigger size, more complicated structure and higher manufacturing cost, thus limit the popularization of the optical communication. Therefore, it becomes a major issue for manufacturer to provide a TOSA with simplified structure and lower manufacturing cost.

SUMMARY OF THE INVENTION

The object of the present invention is to provide a dual wavelength laser device, which is capable of making a TOSA which adopts the dual wavelength laser device could have smaller size, simplified structure and lower manufacturing cost.

In order to achieve aforementioned purpose, the present invention provides a dual wavelength laser device including: a cap, a header, a first laser chip and a second laser chip. The cap includes a cap body and a lens embedded on the cap body. The header forms an accommodating space with the cap. The first laser chip is arranged in the accommodating space and emitting a first laser beam toward the lens. The second laser chip is arranged in the accommodating space and emitting a second laser beam toward the lens.

The present invention provides the dual wavelength laser device with the first laser chip and the second laser chip arranged in a single package formed by the header and the cap. A TOSA used in triple-wavelength bidirectional WDM optical transmission system can be obtained by assembling the dual wavelength laser device with a TO-CAN packaged detecting device. Such that the TOSA which has only two TO-CAN packaged device could have smaller size, simplified structure and lower manufacturing cost.

BRIEF DESCRIPTION OF THE DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

A detailed description of the present invention will be made with reference to the accompanying drawings.

Figure 1:
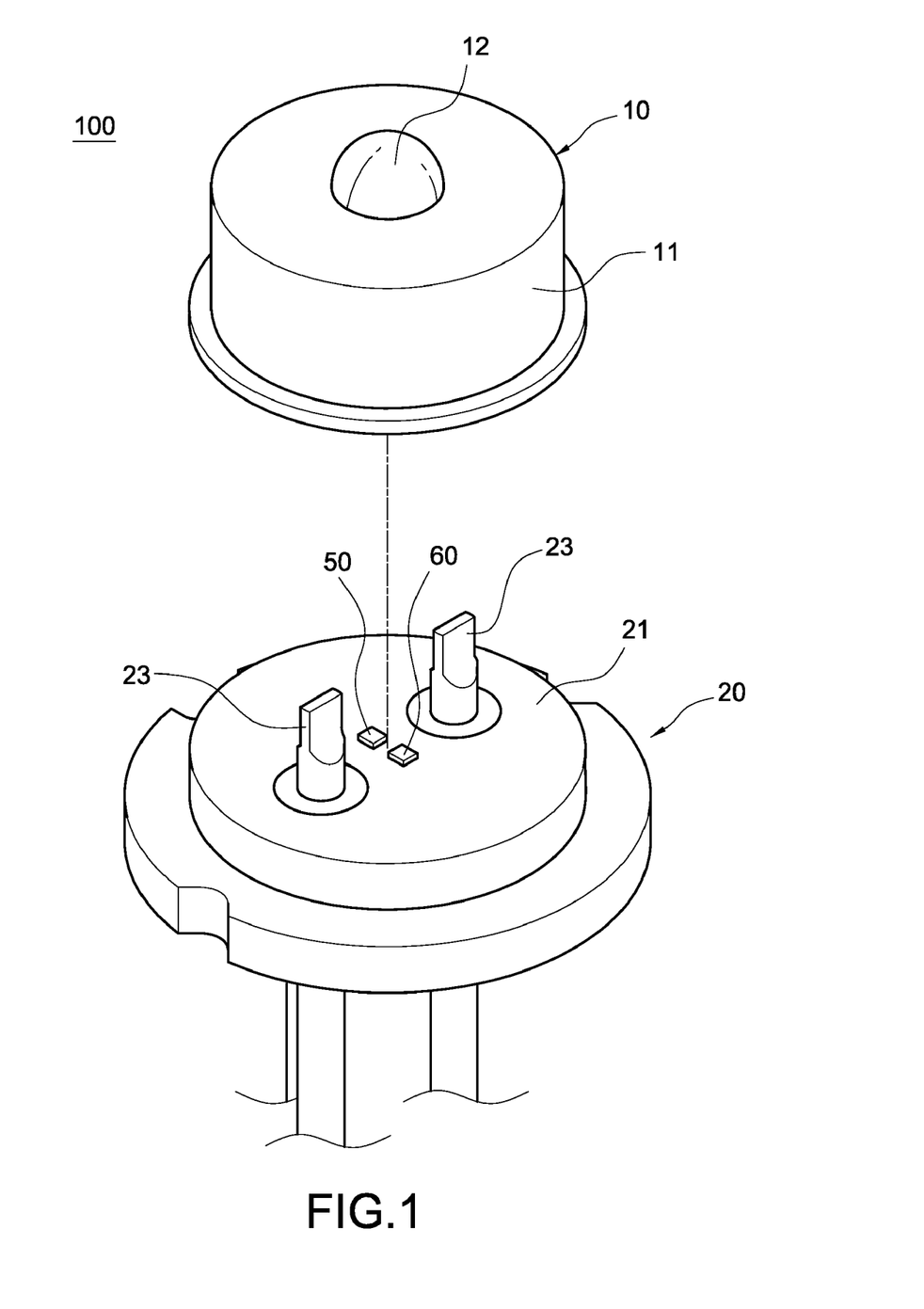
FIG. 1 is a perspective view of dual wavelength laser device according to a first embodiment of the present invention.
Figure 2:
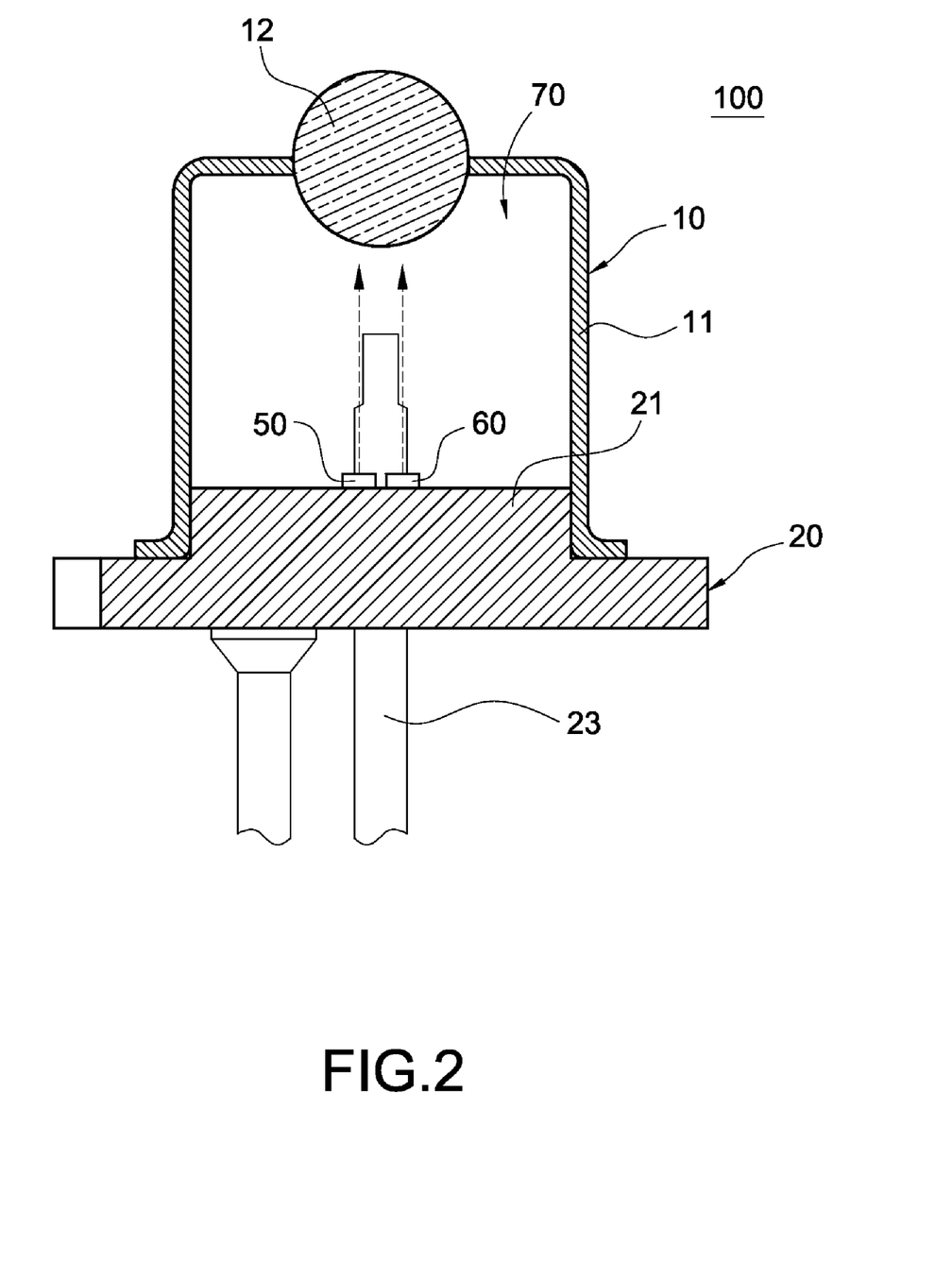
FIG. 2 is a cross sectional view of dual wavelength laser device in FIG. 1.

FIG. 1 and FIG. 2 show a dual wavelengths laser device 100 according to a first embodiment of the present invention. The dual wavelengths laser device 100 includes a cap 10, a header 20, a first laser chip 50 and a second laser chip 60.

The cap 10 includes a cap body 11 and a lens 12 embedded on the cap body 11. In this embodiment, the lens 12 can be a ball lens, but not limited to in practical use.

The header 20 is made of metal material and includes a base plate 21 which formed an accommodating space 70 (see FIG. 2) with the cap 10, and a plurality of metal lead 23 passed through the base plate 21 and protruded into the space 70. A TO-CAN type package is formed by the header 20 and the cap 10. In this embodiment, the TO-CAN is TO-46 type, but in practical use, the TO-CAN can be TO-56 type and not limited to.

The first laser chip 50 and the second laser chip 60 are arranged in the accommodating space 70 and located on a top face of the base plate 21 of the header 20. The first laser chip 50 emits a first laser beam toward the lens 12. The second laser chip 60 emits a second laser beam toward the lens 12.

The first laser chip 50 and the second laser chip 60 both are made of semiconductor material. In this embodiment, the first laser chip 50 is a vertical cavity surface emitting laser (VCSEL) and the second laser chip 60 is a horizontal cavity surface emitting laser (HCSEL). But in practical use, the first laser chip 50 and the second laser chip 60 can both be either the VCSEL or the HCSEL.

In this embodiment, the wavelength of the first laser beam emitted by the first laser chip 50 is 1310 nm and the wavelength of the second laser beam emitted by the second laser chip 60 is 1550 nm. In practical use, the wavelength of the first laser beam and the second laser beam both can be altered depending on the practical situation but must be different with each other.

Figure 3:
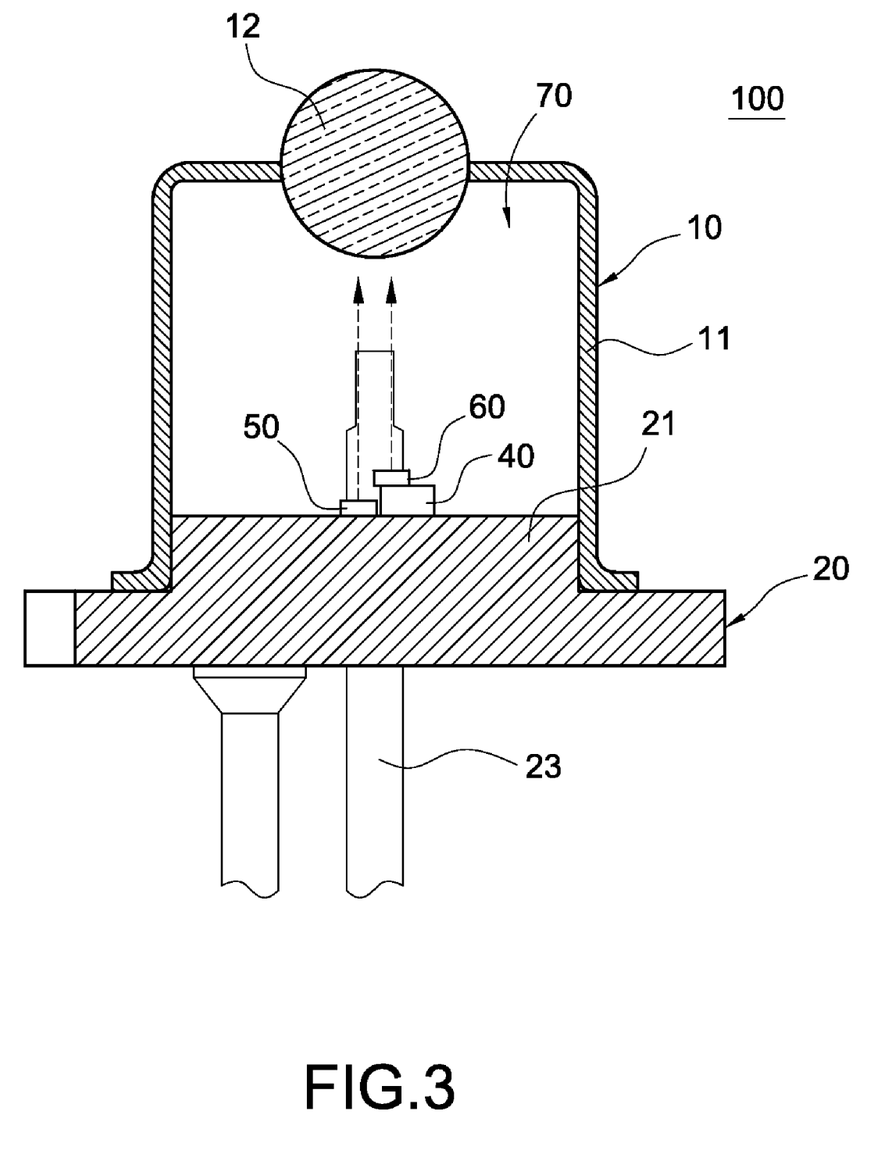
FIG. 3 is a cross sectional view of dual wavelength laser device according to a second embodiment of the present invention.

FIG. 3 shows a dual wavelengths laser device 100 according to a second embodiment of the present invention, which is similar to the first embodiment of the present invention. The differences is that the dual wavelengths laser device 100 further includes a submount 40 arranged between the base plate 21 of the header 20 and second laser chip 60.

The submount 40 is arranged on the top face of the base plate 21. The submount 40 is made of silicon, for example, can be made from a silicon wafer. In practical use, the submount 40 can be either insulating material or conductive material. Besides, the thickness of the submount 40 can be selected according to requirement to adjust the optical focus of the laser beam emitted by the second laser chip 60, or to adjust the distance between the two axes of the two laser beams of the first laser chip 50 the second laser chip 60.

The first laser chip 50 is arranged on the top face of the base plate 21 and is adjacent to the submount 40. The second laser chip 60 is arranged on the submount 40. A first laser beam and a second laser beam are emitted toward the lens 12 respectively by the first laser chip 50 and the second laser chip 60.

Since the second laser chip 60 is lifted by the submount 40, the heights of the first laser chip 50 and the second laser chip 60 are different. Such that the first laser chip 50 can be a little overlapped with the second laser chip 60 and the first laser beam of the first laser chip 50 can be closer to the second laser beam of the second laser chip 60.

Figure 4:
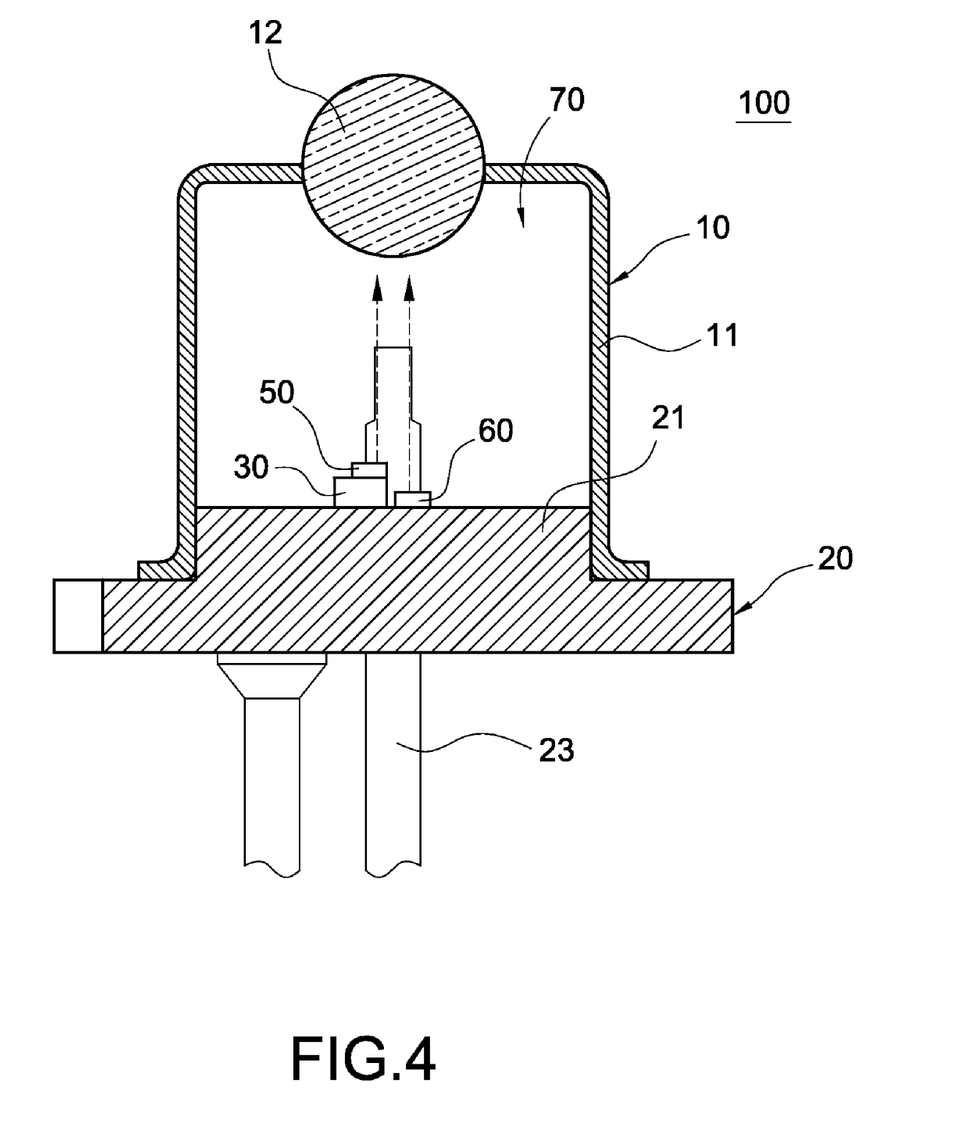
FIG. 4 is another kind of dual wavelength laser device according to the second embodiment of the present invention.
Figure 5:
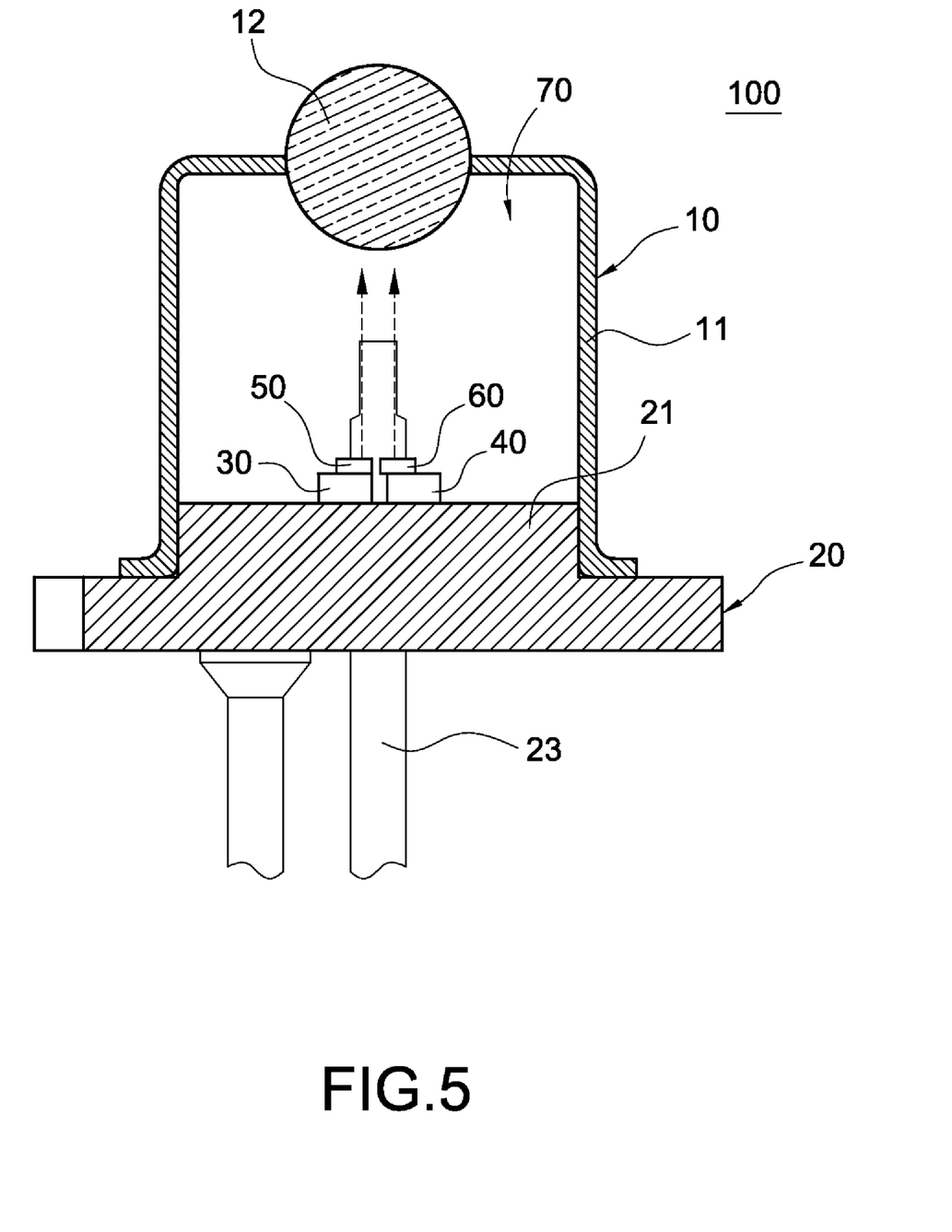
FIG. 5 is another kind of dual wavelength laser device according to the second embodiment of the present invention.

In addition, as FIG. 4 shows, another submount 30 can be arranged between the base plate 21 of header 20 and the first laser chip 50 to lift the first laser chip 50 to an appropriate height so as to obtain better optical performance. Further more, as FIG. 5 shows, a submount 30 is arranged between the base plate 21 of header 20 and the first laser chip 50 and another submount 40 is arranged between the base plate 21 of header 20 and the second laser chip 60.

Figure 6:
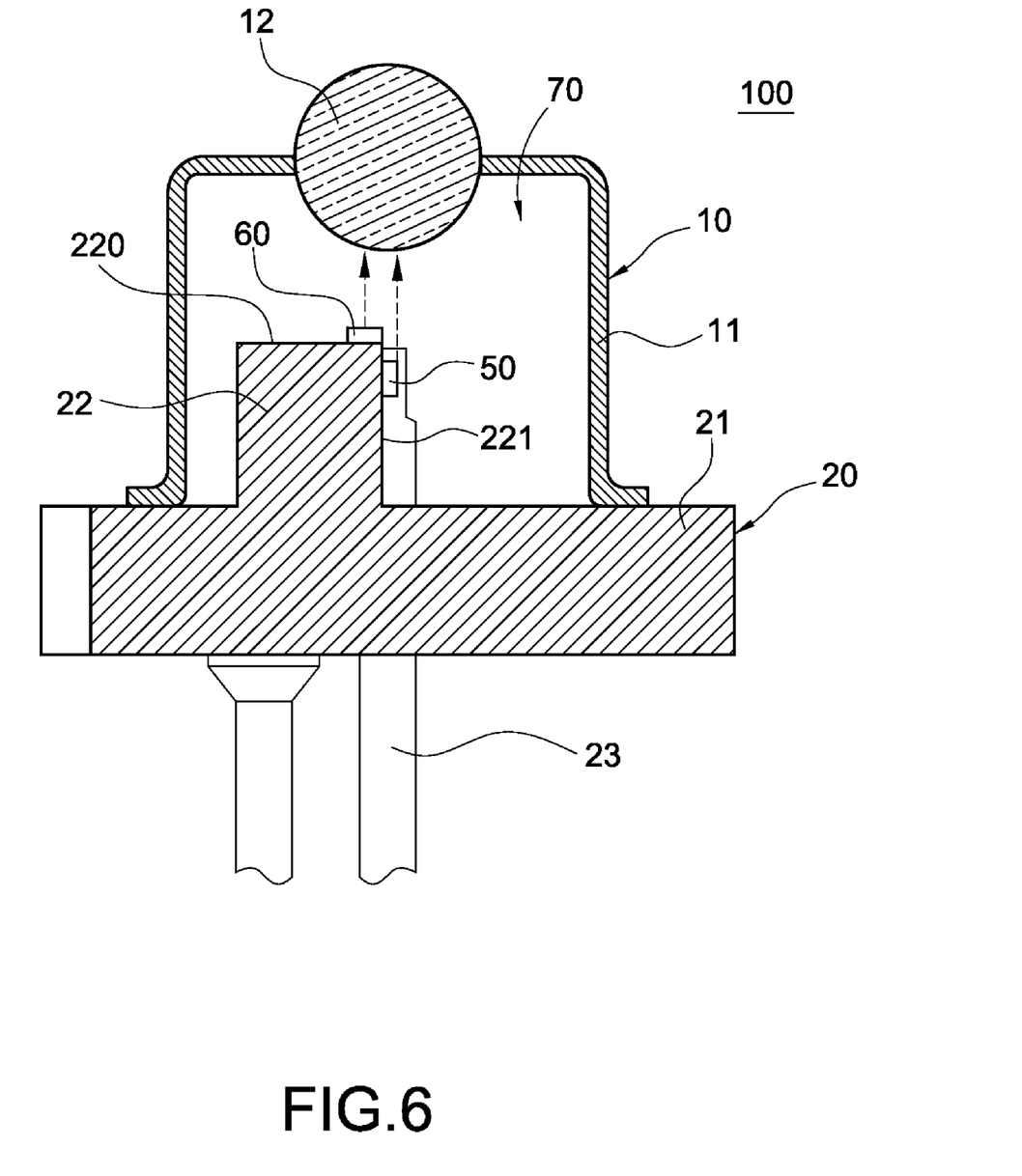
FIG. 6 is a cross sectional view of dual wavelength laser device according to a third embodiment of the present invention.

FIG. 6 shows a dual wavelengths laser device 100 according to a third embodiment of the present invention, which is similar to the first embodiment of the present invention. The difference is that a protrusion 22 is further arranged on the top face of the base plate 21. The protrusion 22 has a top face 220 faced to the lens 12 and a side face 221 downwardly extended from the top face 220.

In addition, the first laser chip 50 is an edge emitting laser diode (EELD) which is made of semiconductor material. The first laser chip 50 is arranged on the side face 221 and emits a first laser beam toward the lens 12. The second laser chip 60 can be a VCSEL or a HCSEL which is made of semiconductor material. The second laser chip 60 is arranged on the top face 220 and emits a second laser beam toward the lens 12.

Since the side face 221 which is capable for arranging the EELD type first laser chip 50 is provided by the protrusion 22 of the header 20, the EELD type first laser chip 50 could upwardly emit the first laser beam to the lens 12.

Figure 7:
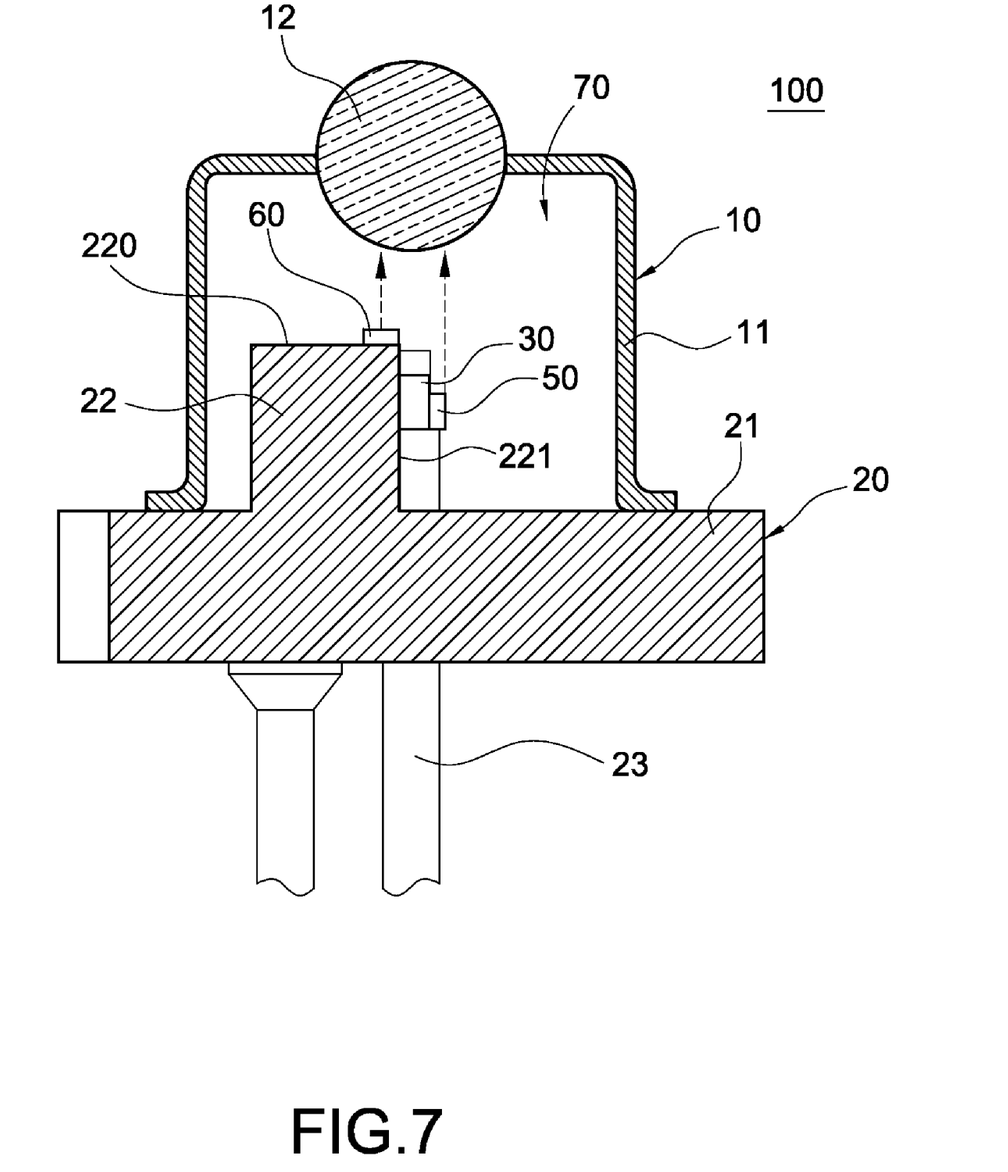
FIG. 7 is another kind of dual wavelength laser device according to the third embodiment of the present invention.
Figure 8:
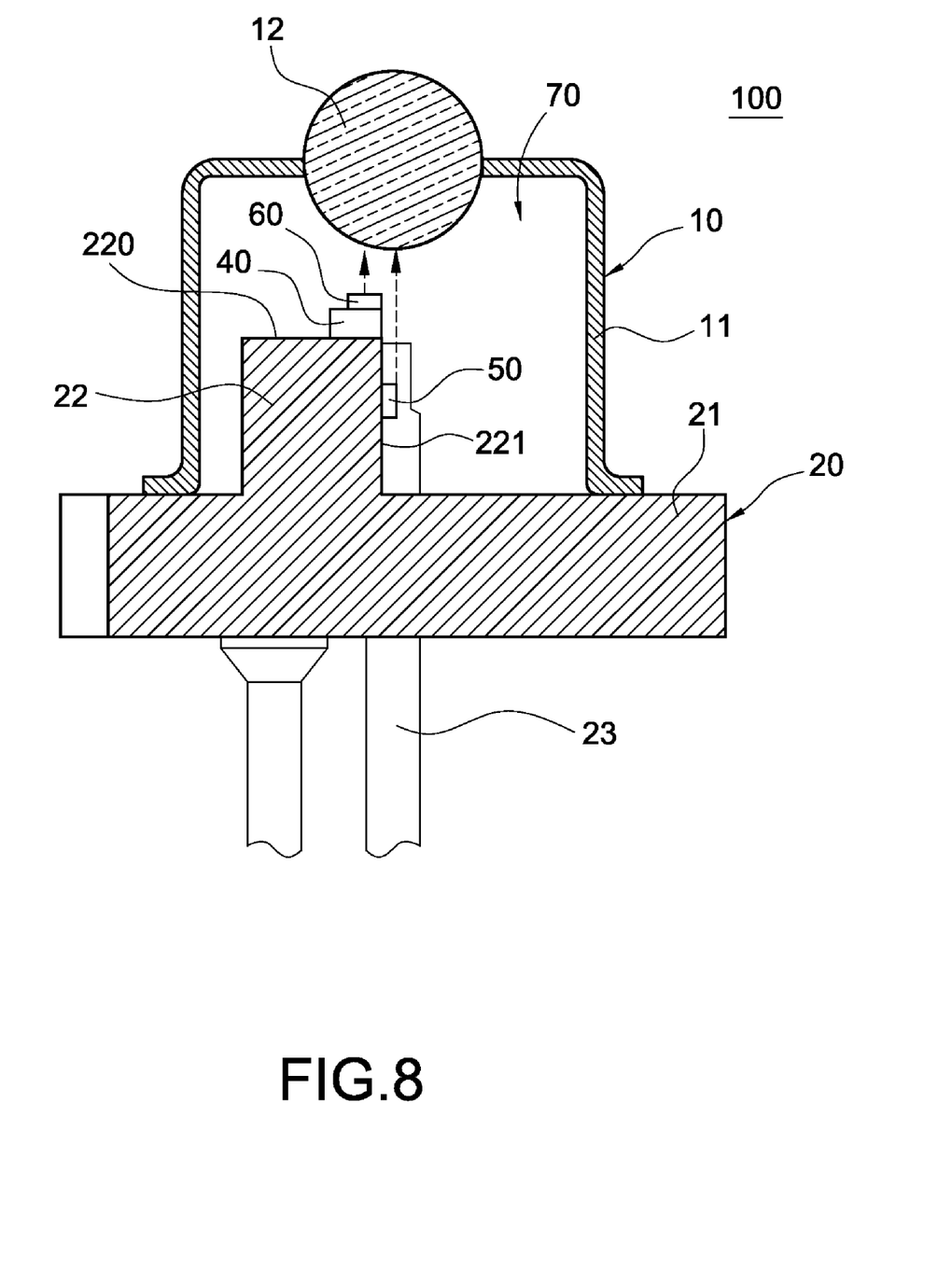
FIG. 8 is another kind of dual wavelength laser device according to the third embodiment of the present invention.
Figure 9:
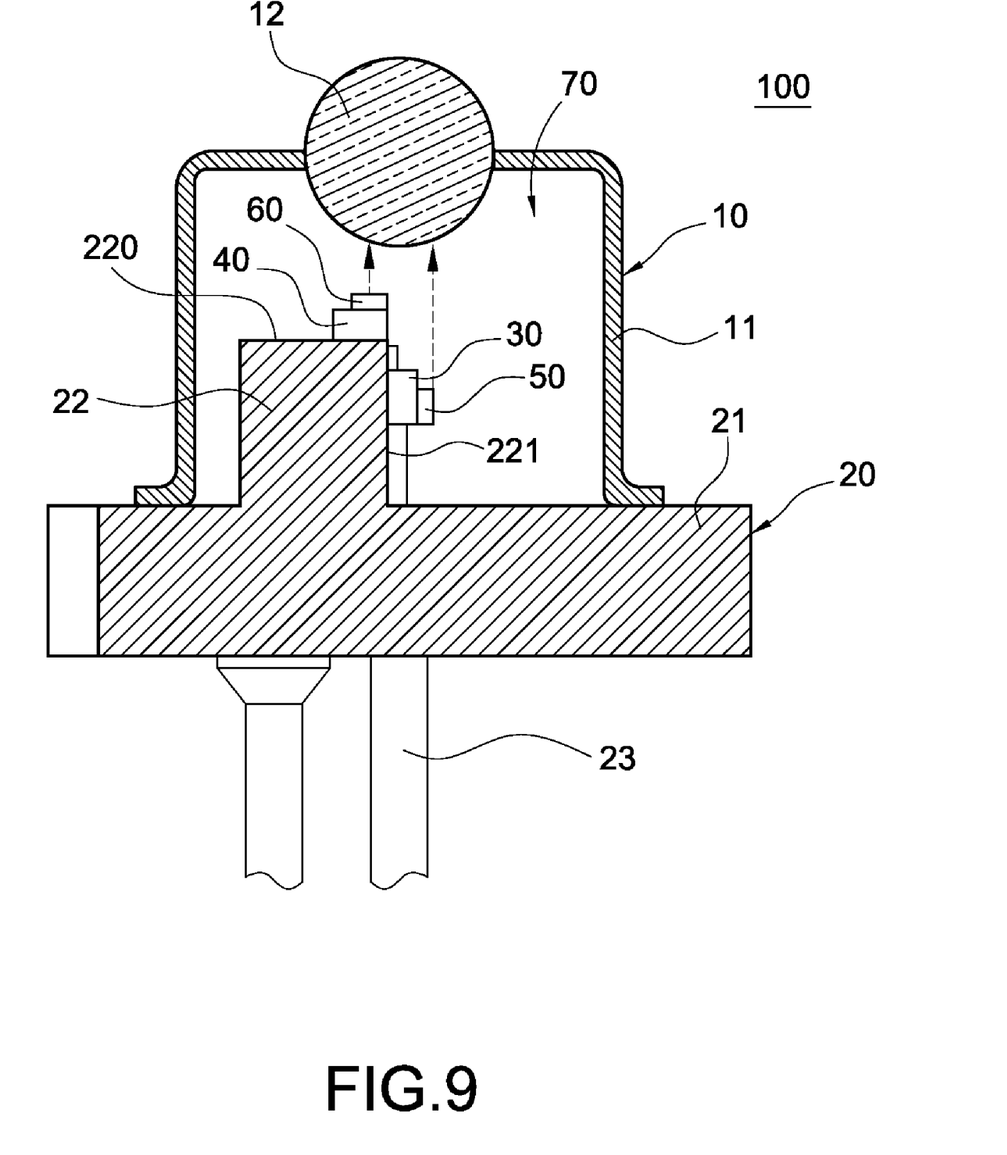
FIG. 9 is another kind of dual wavelength laser device according to the third embodiment of the present invention.

Besides, in order to obtain better optical performance, as FIG. 7, a submount 30 is further arranged between the side face 221 of the protrusion 22 and the first laser chip 50, such that the position of the first laser chip 50 relative to the lens 12 could be adjusted. As FIG. 8 shows, a submount 40 is further arranged between the top face 220 of the protrusion 22 and the second laser chip 60, such that the position of the second laser chip 60 relative to the lens 12 could be adjusted. As FIG. 9 shows, a submount 30 is arranged between the side face 221 of the protrusion 22 and the first laser chip 50 and a submount 40 is arranged between the top face 220 of the protrusion 22 and the second laser chip 60, such that the position of the second laser chip 60 relative to the lens 12 could be adjusted. The submount 30, 40 can be made of insulating material or conductive material.

Figure 10:
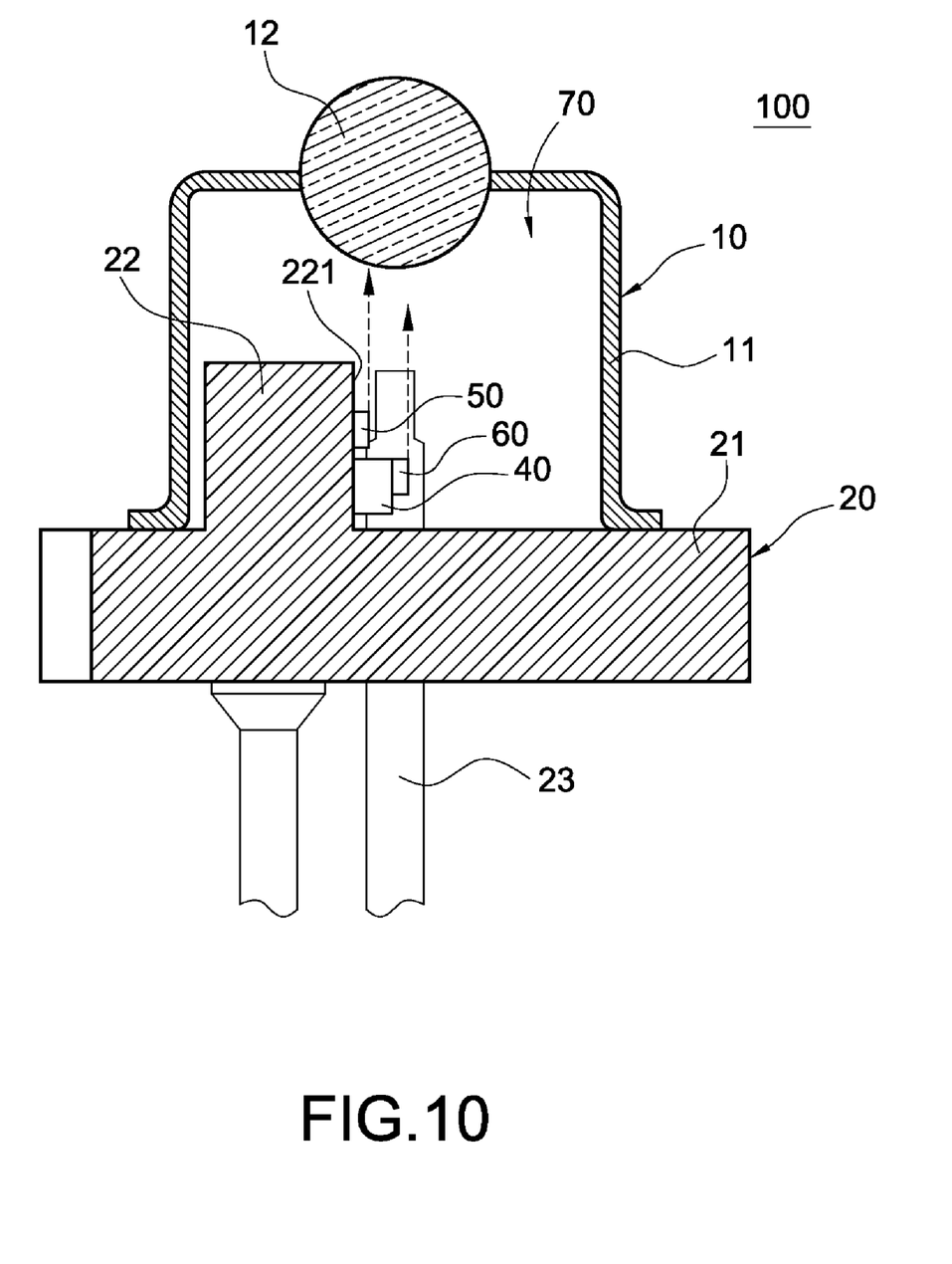
FIG. 10 is a cross sectional view of dual wavelength laser device according to a fourth embodiment of the present invention.

FIG. 10 shows a dual wavelengths laser device 100 according to a fourth embodiment of the present invention, which is similar to the third embodiment of the present invention. The difference is that the first laser chip 50 and the second laser chip 60 both are EELD and both are arranged on the side face 221. And the second laser chip 60 is located between the first laser chip 50 and the base plate 21.

In addition, a submount 40 is further arranged between the second laser chip 60 and the side face 221. The submount 40 is made of silicon, for example, can be made from a silicon wafer. In practical use, the submount 40 can be either insulating material or conductive material.

Figure 11:
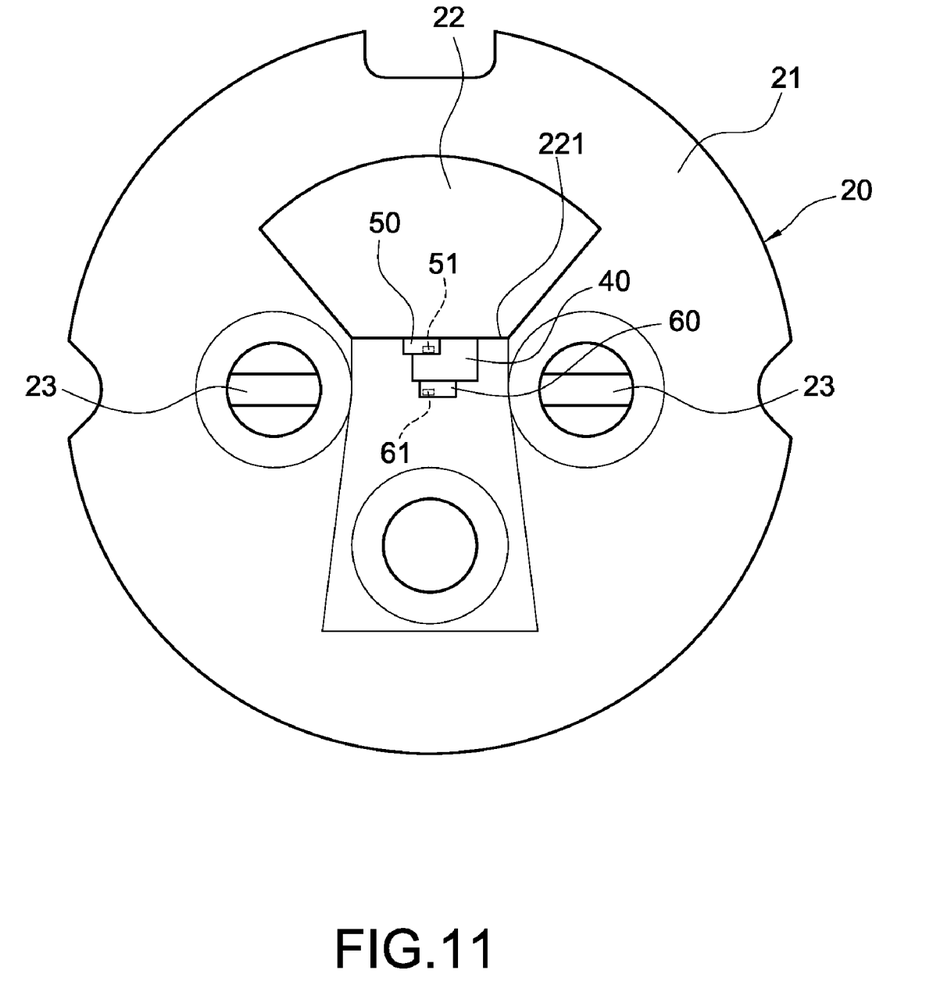
FIG. 11 is top view of the dual wavelength laser device in FIG. 10.

As FIG. 10 and FIG. 11 show, a face of the first laser chip 50 which faces to the lens 12 has a first emitting area 51 for emitting a first laser beam. A face of the second laser chip 60 which faces to the lens 12 has a second emitting area 61 for emitting a second laser beam.

In this embodiment, the wavelength of the first laser beam emitted by the first laser chip 50 is 1310 nm and the wavelength of the second laser beam emitted by the second laser chip 60 is 1550 nm. In practical use, the wavelength of the first laser beam and the second laser beam both can be altered depending on the practical situation but must be different with each other.

Since the second laser chip 60 is lifted from the side face 221 by the submount 40, the second emitting area 61 will not be blocked by the first laser chip 50 and can directly face to the lens 12. Such that the first laser beam emitted from the first emitting area 51 and second laser beam emitted from the second emitting area 61 both can be directly emitted to the lens 12.

Figure 12:
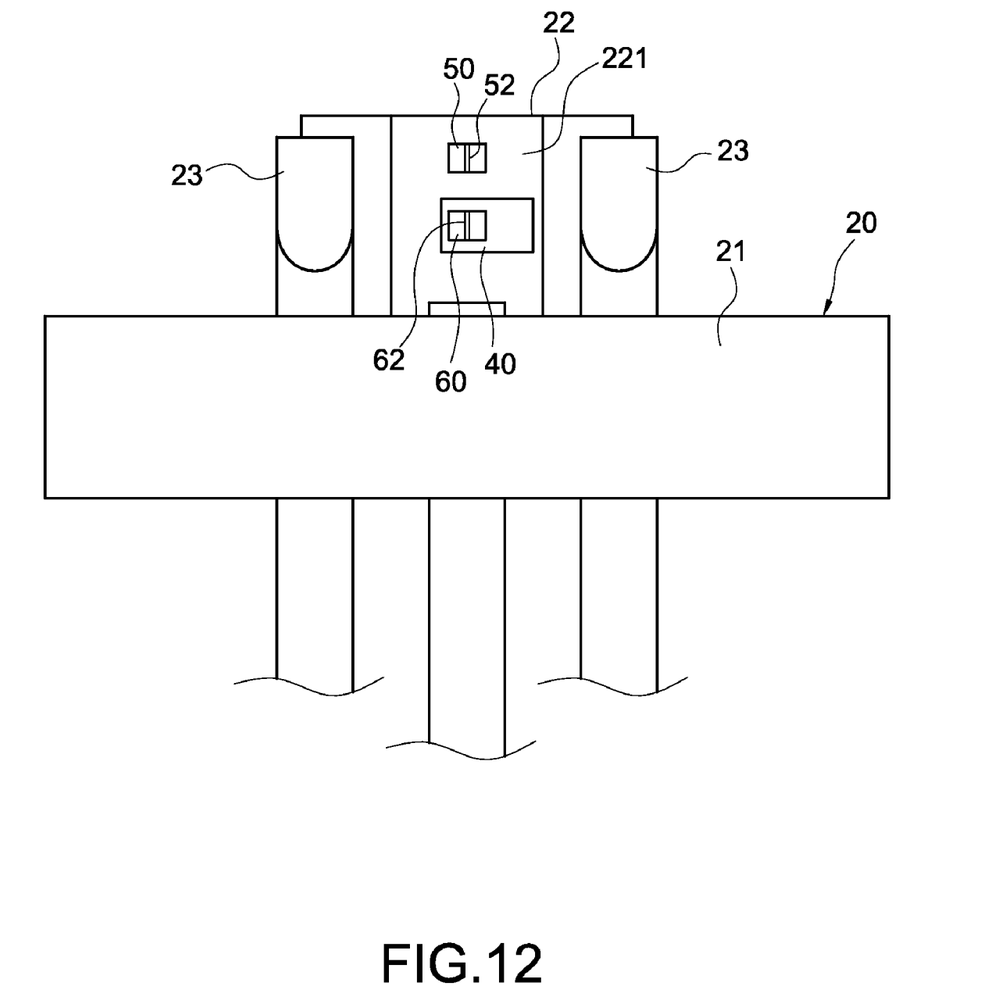
FIG. 12 is side view of the dual wavelength laser device in FIG. 10.

As FIG. 11 and FIG. 12 show, a first rib-like structure 52 which is orthogonal to the first emitting area 51 is formed on a face of the first laser chip 50. A second rib-like structure 62 which is orthogonal to the second emitting area 61 is formed on a face of the second laser chip 60. The extending direction of the first rib-like structure 52 is substantially parallel to the extending direction of the second rib-like structure 62.

Figure 13:
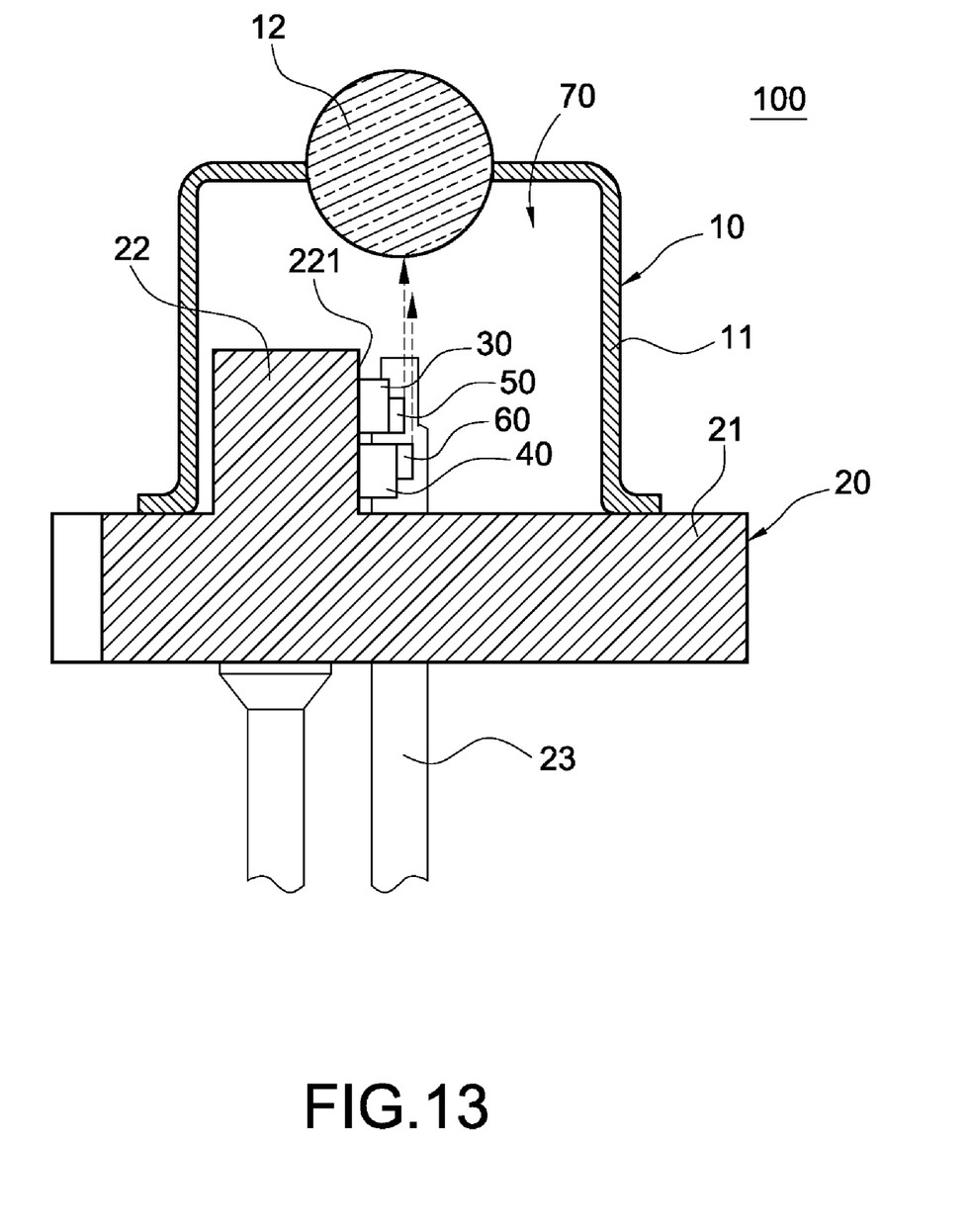
FIG. 13 is another kind of dual wavelength laser device according to the fourth embodiment of the present invention.

In addition, as FIG. 13 shows, a submount 30 is arranged between the first laser chip 50 and the side face 221 to adjust the position of the first laser chip 50 relative to the lens 12. The submount 30, 40 can be made of insulating material or conductive material.

In order to make the laser beams of the first laser chip 50 and the second laser chip 60 directly emit to the lens 12, the thickness of the submount 40 between the second laser chip 60 and the side face 221 must be greater than the thickness of the submount 30 between the first laser chip 50 and the side face 221. Such that the first laser beam emitted from the first laser chip 50 and second laser beam emitted from the second laser chip 60 both can be directly emitted to the lens 12.

The present invention provides a dual wavelength laser device 100 with the first laser chip 50 and the second laser chip 60 arranged in a single package formed by the header 20 and the cap 10. A TOSA used in triple-wavelength bidirectional WDM optical transmission system can be obtained by assembling the dual wavelength laser device 100 with a TO-CAN packaged detecting device. Such that the TOSA which has only two TO-CAN packaged device could have smaller size, simplified structure and lower manufacturing cost.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A dual wavelength laser device adapted for optical communication, comprising:
   a cap comprising a cap body and a lens embedded on top of the cap body;
   a header including a base plate formed an accommodating space with the cap body while the header and the cap form a TO-CAN type package;
   a first submount arranged on a top surface of the base plate, the top surface facing the lens;
   a first laser chip arranged on the first submount and emitting a first laser beam toward the lens; and
   a second laser chip directly arranged on the top surface of the base plate and emitting a second laser beam toward the lens,
   wherein since the first laser chip is lifted by the first submount, the heights of locations of the first laser chip and the second laser chip are different, such that the second laser chip can be a little overlapped with the first laser chip along a laser beam emitting direction and the second laser beam of the second laser chip can be closer to the first laser beam of the first laser chip.

2. The dual wavelength laser device according to claim 1, wherein the first laser chip and the second laser chip are vertical cavity surface emitting lasers (VCSELs) or horizontal cavity surface emitting lasers (HCSELs).

3. The dual wavelength laser device according to claim 1, wherein the base plate is protruded upwards from a substrate to be engaged with the cap body so that the accommodating space is formed therebetween.

4. The dual wavelength laser device according to claim 1, wherein the wavelength of the first laser beam emitted by the first laser chip is 1310 nm and the wavelength of the second laser beam emitted by the second laser chip is 1550 nm.

5. A dual wavelength laser device adapted for optical communication, comprising:
   a cap comprising a cap body and a lens embedded on top of the cap body; and
   a header including a base plate formed an accommodating space with the cap body and a protrusion arranged on the base plate while the header and the cap form a TO-CAN type package, the protrusion having a top surface and a continuous side surface downwardly extended from the top surface with no step for arranging a first laser chip which emits a first laser beam toward the lens and a second laser chip which emits a second laser beam toward the lens,
   wherein the first laser chip is directly arranged on the continuous side surface, a submount is arranged on the continuous side surface below the first laser chip along a laser beam emitting direction and the second laser chip is arranged on the submount; since the second laser chip is lifted from the side surface by the submount, the second laser beam will not be blocked by the first laser chip and can directly face to the lens, such that the first laser beam and second laser beam both can be directly emitted to the lens.

6. The dual wavelength laser device according to claim 5, wherein the first laser chip or the second laser chip is an edge emitting laser diode (EELD).

7. The dual wavelength laser device according to claim 5, wherein the wavelength of the first laser beam emitted by the first laser chip is 1310 nm and the wavelength of the second laser beam emitted by the second laser chip is 1550 nm.

* * * * *